(12) United States Patent
Nakamura

(10) Patent No.: US 7,479,345 B2
(45) Date of Patent: *Jan. 20, 2009

(54) CIRCUIT ASSEMBLY FOR BATTERY PACK OR THE LIKE, AND METHOD OF MAKING THE SAME

(75) Inventor: Satoshi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/191,506

(22) Filed: Jul. 28, 2005

(65) Prior Publication Data

US 2005/0263572 A1 Dec. 1, 2005

Related U.S. Application Data

(62) Division of application No. 10/170,014, filed on Jun. 11, 2002, now abandoned.

(30) Foreign Application Priority Data

Jun. 12, 2001 (JP) .............................. 2001-177271

(51) Int. Cl.
*H01M 2/14* (2006.01)
*H01R 12/00* (2006.01)

(52) U.S. Cl. ......................................... 429/129; 439/65
(58) Field of Classification Search ....................... None
See application file for complete search history.

(56) References Cited

U.S. PATENT DOCUMENTS

| 4,687,695 | A | 8/1987 | Hamby |
| 4,845,479 | A | 7/1989 | Marincic |
| 5,531,022 | A | 7/1996 | Beaman et al. |
| 5,619,108 | A * | 4/1997 | Komurasaki et al. ........ 318/140 |
| 5,844,783 | A | 12/1998 | Kojima |
| 6,031,730 | A * | 2/2000 | Kroske ........................ 361/784 |
| 6,045,367 | A | 4/2000 | Maldonado |
| 6,079,987 | A | 6/2000 | Matsunaga et al. |
| 6,129,558 | A * | 10/2000 | Kihira et al. ................... 439/66 |
| 6,183,104 | B1 | 2/2001 | Ferrara |
| 6,264,476 | B1 | 7/2001 | Li et al. |
| 6,531,662 | B1 * | 3/2003 | Nakamura ..................... 174/255 |
| 6,623,280 | B2 | 9/2003 | Oldenburg et al. |
| 6,797,891 | B1 | 9/2004 | Blair et al. |
| 6,848,914 | B2 | 2/2005 | Beaman et al. |
| 6,893,753 | B2 * | 5/2005 | Iwaizono et al. ............... 429/7 |
| 2004/0091769 | A1 * | 5/2004 | Kawabata et al. ........... 429/163 |
| 2005/0175889 | A1 * | 8/2005 | Han ............................ 429/61 |
| 2005/0198814 | A1 * | 9/2005 | Yoon .......................... 29/623.4 |
| 2005/0266302 | A1 * | 12/2005 | Kim ............................ 429/62 |

FOREIGN PATENT DOCUMENTS

WO    WO 00/65888    * 11/2000

* cited by examiner

*Primary Examiner*—Kiley Stoner
(74) *Attorney, Agent, or Firm*—Hamre, Schumann, Mueller & Larson, P.C.

(57) ABSTRACT

A circuit assembly includes a first substrate formed with a first wiring pattern, a second substrate formed with a second wiring pattern, and a joint member for electrically and/or mechanically connecting the first substrate to the second substrate. The joint member includes a set of separated leads extending generally parallel to each other, and a first and a second retainers transversely connecting the leads to each other. The first and the second retainers are formed by molding a resin so that they are integral with the leads by allowing the molding resin to enter the spaces between the leads.

4 Claims, 10 Drawing Sheets

CIRCUIT ASSEMBLY FOR BATTERY PACK OR THE LIKE, AND METHOD OF MAKING THE SAME

This application is a divisional of application Ser. No. 10/170,014, filed 11 Jun. 2002, entitled CIRCUIT ASSEMBLY FOR BATTERY PACK OR THE LIKE, AND METHOD OF MAKING THE SAME, which application(s) are incorporated herein by reference.

BACKGROUND OF THE INVENTION

1. Field of the Invention

The present invention relates to a circuit assembly advantageously used in e.g. a battery pack of a notebook computer, mobile phone, etc. The present invention also relates to a battery pack provided with such a circuit assembly. Further, the present invention relates to a method of making such a circuit assembly.

2. Description of the Related Art

Conventionally, various types of battery packs are used for portable electronic devices such as notebook computers and cellular phones. These battery packs are removable and incorporate a lithium battery, for example.

FIG. 14 is a partial cut-away view showing the inside of a typical battery pack provided with a circuit assembly 10 the plan view of which is shown in FIG. 15. The circuit assembly 10, together with a number of batteries 2, is accommodated in the box-like, rectangular housing 1 of the battery pack P. A connector C and several electronic components E are mounted on the circuit assembly 10. The batteries 2 are connected to the circuit assembly 10. The circuit assembly 10 regulates the charging or discharging of the batteries 2 and controls the passage of electric signals to or from an external circuit.

When the battery pack P is used for a notebook computer for example, there is an upper limit to the size of the housing 1 due to the restricted accommodation space of the computer. Accordingly, the housing 1 may not provide a large internal space for the parts other than the batteries 2.

In light of this, as shown in FIG. 15, the circuit assembly 10 includes first and second substrates 11, 12 to be suitably accommodated in the housing 1. The two substrates 11 and 12 are electrically and mechanically connected to each other via a joint member 41 which is bendable. This allows the circuit assembly 10, when accommodated in the housing 1, to be bent at right angles, as seen from FIG. 14, with the first substrate 11 being arranged along a shorter side wall of the housing 1 and the second substrate 12 being arranged along a longer side wall of the housing 1.

The first substrate 11 and the second substrate 12 are formed with a wiring pattern 42 on one or both surfaces of the respective substrates. Being connected to the wiring pattern 42, the connector C and the electronic components E are mounted on the substrates 11 and 12, respectively. Each substrate 11, 12 has an end portion provided with a number of terminals 43 to which the wiring pattern 42 is connected. The leads (to be mentioned below) of the joint member 41 are also connected to the terminals 43.

FIG. 16 is a perspective view showing the joint member 41. The joint member 41 includes a plurality of leads 44 arranged in parallel to each other, and insulating films 45 sandwiching the leads 44 from above and below. The leads 44 are configured to have a plateau in their middle portions. The ends of each lead 44 are connected to the terminals 43 formed on the substrates 11 and 12, whereby the substrates 11 and 12 are electrically and mechanically connected to each other.

In the above-described joint member 41, the regularly spaced leads 44 are held in place rather unstably by the pressing force of the two films 45. This arrangement, however, may permit the leads 44 to shift in position between the films 45 and even come into contact with each other when the joint member 14 is bent or vibrated for example. Unfavorably, when the leads 44 are short-circuited, the proper function of the circuit assembly 10 will fail.

DISCLOSURE OF THE INVENTION

An object of the present invention is to provide a circuit assembly which is capable of properly transmitting electric signals by preventing short-circuiting between the leads of a joint member that connects a plurality of substrates.

Another object of the present invention is to provide a battery pack provided with such a circuit assembly.

Another object of the present invention is to provide a method of making such a circuit assembly.

According to a first aspect of the present invention, there is provided a circuit assembly comprising: a first substrate formed with a first wiring pattern; a second substrate formed with a second wiring pattern; and a joint member for electrically and/or mechanically connecting the first and the second substrates. The joint member includes a set of separated leads extending generally parallel to each other, and a retainer transversely connecting the leads to each other. The retainer is formed by molding a resin so as to be integral with the leads, part of the molding resin filling spaces between the leads.

Preferably, the set of leads are bent at a position avoiding the retainer.

According to a second aspect of the present invention, there is provided a circuit assembly comprising: a first substrate formed with a first wiring pattern; a second substrate formed with a second wiring pattern; and a joint member for electrically and/or mechanically connecting the first and the second substrates. The joint member includes a set of separated leads extending generally parallel to each other, and a first and a second retainers for transversely connecting the leads to each other. Each of the first and the second retainers is formed by molding a resin so as to be integral with the leads, the molding resin filling spaces between the leads.

Preferably, the set of leads are bent between the first retainer and the second retainer.

Preferably, the first retainer is arranged adjacent to the first substrate, while the second retainer is arranged adjacent to the second substrate.

Preferably, the joint member further includes insulating tapes sandwiching the set of leads from above and below between the first retainer and the second retainer.

According to a third aspect of the present invention, there is provided a battery pack comprising: a housing for accommodating a set of batteries; and a circuit assembly accommodated in the housing at a corner of the housing, the circuit assembly including a first substrate formed with a first wiring pattern, a second substrate formed with a second wiring pattern, and a joint member for electrically and/or mechanically connecting the first and the second substrates. The joint member includes a set of separated leads extending generally parallel to each other, and a retainer transversely connecting the leads to each other. The retainer is formed by molding a resin so as to be integral with the leads, the molding resin filling spaces between the leads.

According to a fourth aspect of the present invention, there is provided a battery pack comprising: a housing for accommodating a set of batteries; and a circuit assembly accommodated in the housing at a corner thereof, the circuit assembly including a first substrate formed with a first wiring pattern, a second substrate formed with a second wiring pattern, and a joint member for electrically and/or mechanically connecting the first and the second substrates. The joint member includes a set of separated leads extending generally parallel to each other, and a first and a second retainers transversely connecting the leads to each other. Each of the first and the second retainers is formed by molding a resin so as to be integral with the leads, the molding resin filling spaces between the leads.

Preferably, at a corner of the housing, fixing grooves are formed in an inner surface of the housing for fixing the first retainer and the second retainer of the joint member.

According to a fifth aspect of the present invention, there is provided a method of making a circuit assembly comprising the steps of: making a bendable joint member; and electrically and/or mechanically connecting a first substrate to a second substrate with the joint member. In the joint member making step, a resin material is injected into a mold in which an elongated conductor frame including plural sets of leads is inserted, so that a retainer is formed to be integral with the leads and extends longitudinally of the conductor frame across the plural sets of leads. Then, each set of the leads is cut from the conductor frame after the resin material hardens. The retainer is also cut from the conductor frame for the respective sets of leads.

Other features and advantages of the present invention will become clearer from the description of the preferred embodiment given below with reference to the accompanying drawings.

DETAILED DESCRIPTION OF THE PREFERRED EMBODIMENTS

Preferred embodiments of the present invention will be described below with reference to the accompanying drawings.

Figure 1:
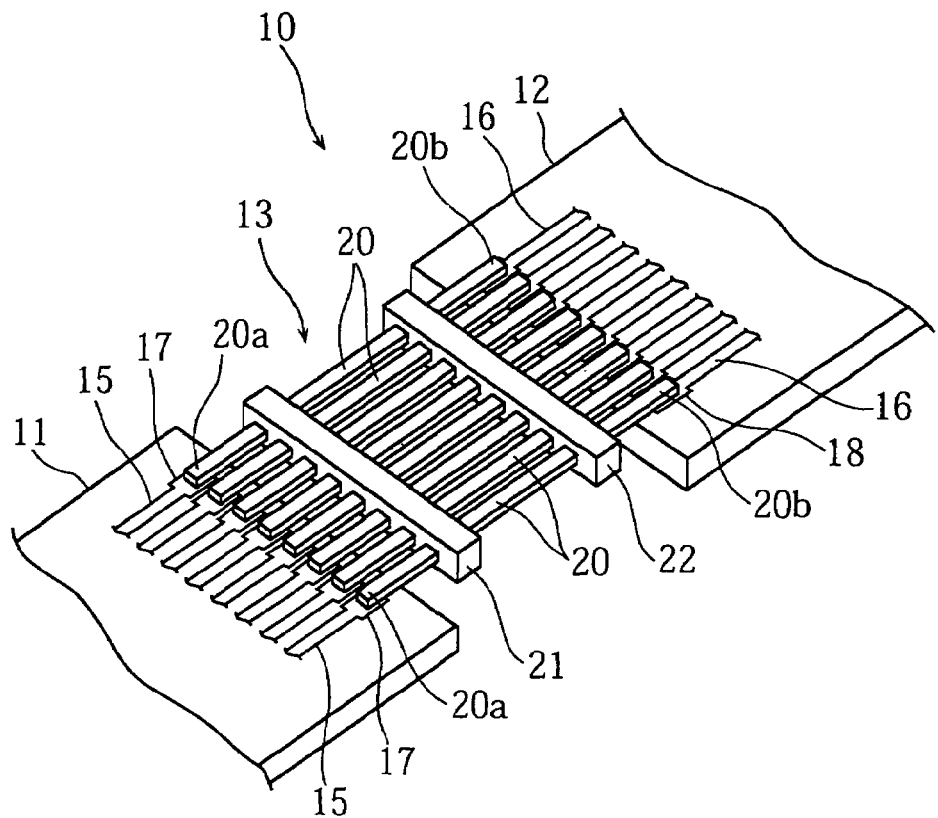
FIG. 1 is a perspective view illustrating apart of a circuit assembly according to an embodiment of the present invention.
Figure 2:
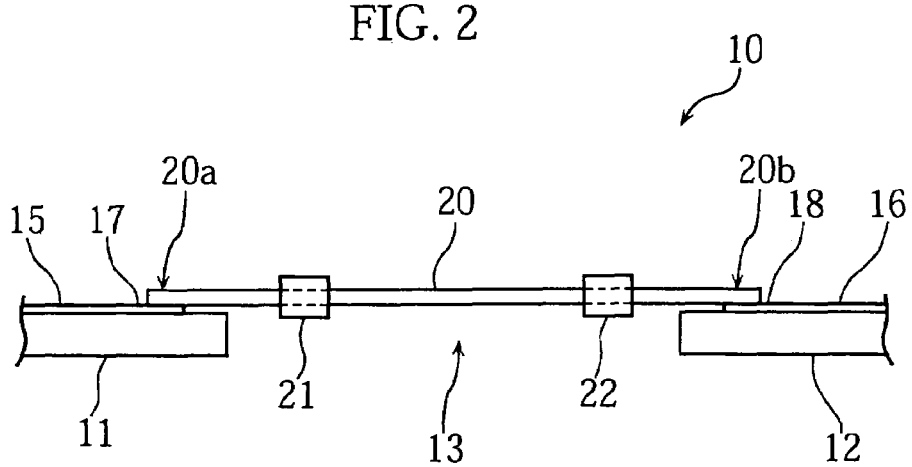
FIG. 2 is a side view of the circuit assembly shown in FIG. 1.
Figure 14:
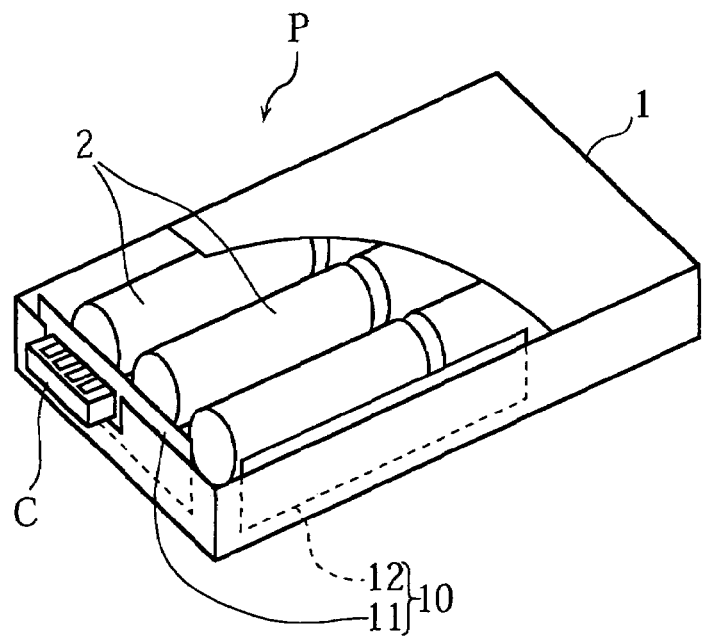
FIG. 14 is a perspective view, which is partially cut away, illustrating a battery pack including a prior-art circuit assembly.
Figure 15:
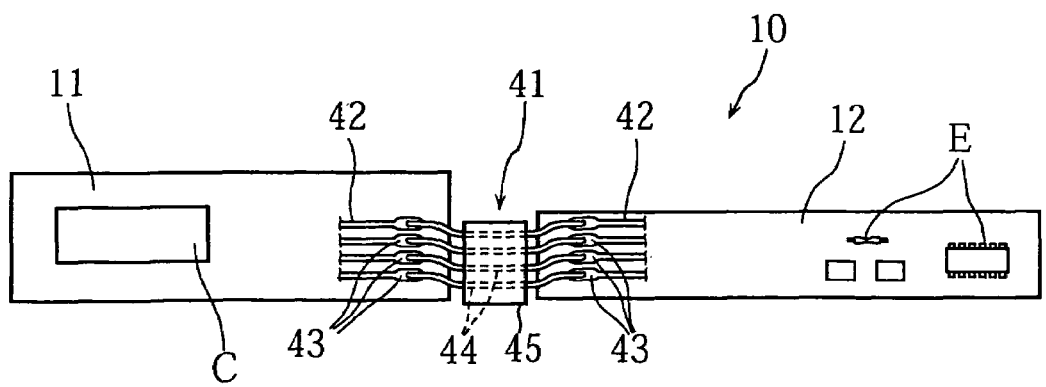
FIG. 15 is a plan view of the circuit assembly shown in FIG. 14.
Figure 16:
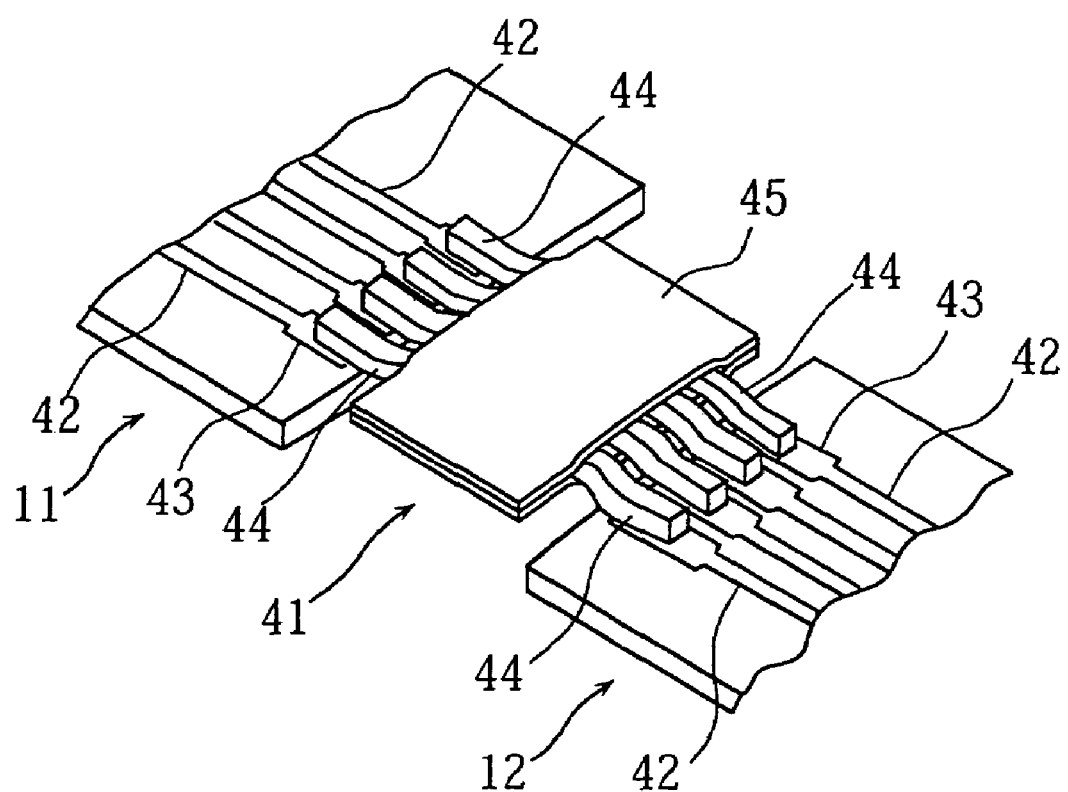
FIG. 16 is a perspective view illustrating a part of the prior art circuit assembly.

FIG. 1 is a perspective view showing a portion of a circuit assembly according to a first embodiment of the present invention. FIG. 2 is a side view of a joint member included in the circuit assembly shown in FIG. 1. Where appropriate, in the following description, reference will be made to FIGS. 14 and 15 illustrating the prior art apparatus.

As shown in FIGS. 1 and 2, the circuit assembly 10 includes a first substrate 11, a second substrate 12, and a bendable joint member 13 for mechanically and/or electrically connecting the two substrates to each other. As in the case shown in FIG. 14, the circuit assembly 10 may typically be arranged in a housing 1 of a battery pack P used for a portable device such as a notebook computer. The housing 1 may have a rectangular box-like configuration, and the battery pack P contains a prescribed number of batteries 2.

In consideration of the accommodation space for the circuit assembly 10 in the battery pack P, the first substrate 11 is so disposed as to be perpendicular to the second substrate 12. Specifically, the joint member 13 is bent (not shown in FIG. 14) in a manner such that the first substrate 11 extends along a shorter side wall of the housing 1, with a connector C exposed to the outside, and that the second substrate 12 extends along a longer side wall of the housing 1. The batteries 2 are connected to the substrates 11, 12 via non-illustrated lead wires for example. Control signals or power supply signals are transmitted between the first substrate 11 and the second substrate 12 via the joint member 13. With this structure, the two substrates 11 and 12 connected by the joint member 13, provide a single integral electric circuit for regulating the battery power, control signals, etc., between the batteries 2 and the external circuit.

The first and the second substrates 11 and 12, which are rigid and have a rectangular configuration, provide a printed circuit board upon which a wiring pattern 15 or 16 is formed for passing the control signals or power signals. The connector C and electronic components E (see FIG. 15), mounted on the substrate 11 or 12, are connected to the wiring pattern 15 or 16. The wiring patterns 15 and 16 are provided with a number of terminals 17 and 18, respectively.

The joint member 13 includes a plurality of parallel leads 20, a first retainer 21 connecting the leads 20 transversely, and a second retainer 22 also connecting the leads 20 transversely. Each of the leads 20 has ends 20a, 20b connected to the terminals 17, 18, respectively, of the substrates 11, 12.

The leads 20 are resilient, thin conductive wires which may be made of nickel or copper. The leads 20, arranged in parallel, are spaced from each other by a predetermined distance in the transverse direction.

The first and the second retainers 21, 22 are formed by resin-molding so that they transverse the leads 20 and are integral with the leads 20 for maintaining the distance between them. It should be noted that the resin material of the retainers 21, 22 fills the spaces between the leads 20, so that the distance between the leads 20 is stabled. The first and second retainers 21, 22 of the present invention may be formed by insert molding from an epoxy resin or silicone resin.

The first retainer 21 is arranged between the substrates 11 and 12 to be close to the first substrate 11. The second retainer 22 is also arranged between the substrates 11 and 12 but to be close to the second substrate 12. In this manner, the first and the second retainers 21, 22 hold the leads 20 together at two different locations.

As described above, each of the retainers 21, 22 fills the spaces between the leads 20 to prevent the initial positional relationship of the leads from varying in the transverse direction. Therefore, upon vibration or bending of the joint member, the parallel leads 20 disposed at the predetermined pitch can remain unmoved, and this considerably reduces the possibility the short-circuiting of the adjacent leads 20. As a result, the circuit assembly 10 functions with high reliability. Further, since the two retainers 21, 22 are spaced from each other in the longitudinal direction of the leads 20, the joint member 13 can be easily bent between the two retainers 21 and 22. Use may be made of only one retainer, but two retainers prevents the short-circuiting more reliably.

As noted above, the first and the second retainers 21, 22 are arranged close to the first and the second substrates 11, 12, respectively. Therefore, each lead 20 can be precisely positioned to the corresponding one of the terminals 17, 18 of the substrates 11, 12 when the joint member 13 is fixed to the substrates 11, 12. This is advantageous to performing precise soldering of the ends 20a, 20b of the lead 20 to the terminals 17, 18 of the substrates 11, 12.

As shown in FIGS. 1 and 2, the first embodiment utilizes two retainers 21, 22. However, use may be made of three or more retainers.

Referring now to FIGS. 3-6, a method for making the circuit assembly 10 will be described below.

For the first and the second substrates 11, 12 of the circuit assembly 10, use may be made of a rigid printed wiring board provided with a wiring pattern formed on one or both surfaces of the board. A connector C and electronic components E (See FIG. 15) are mounted on the substrates 11, 12.

Figure 3:
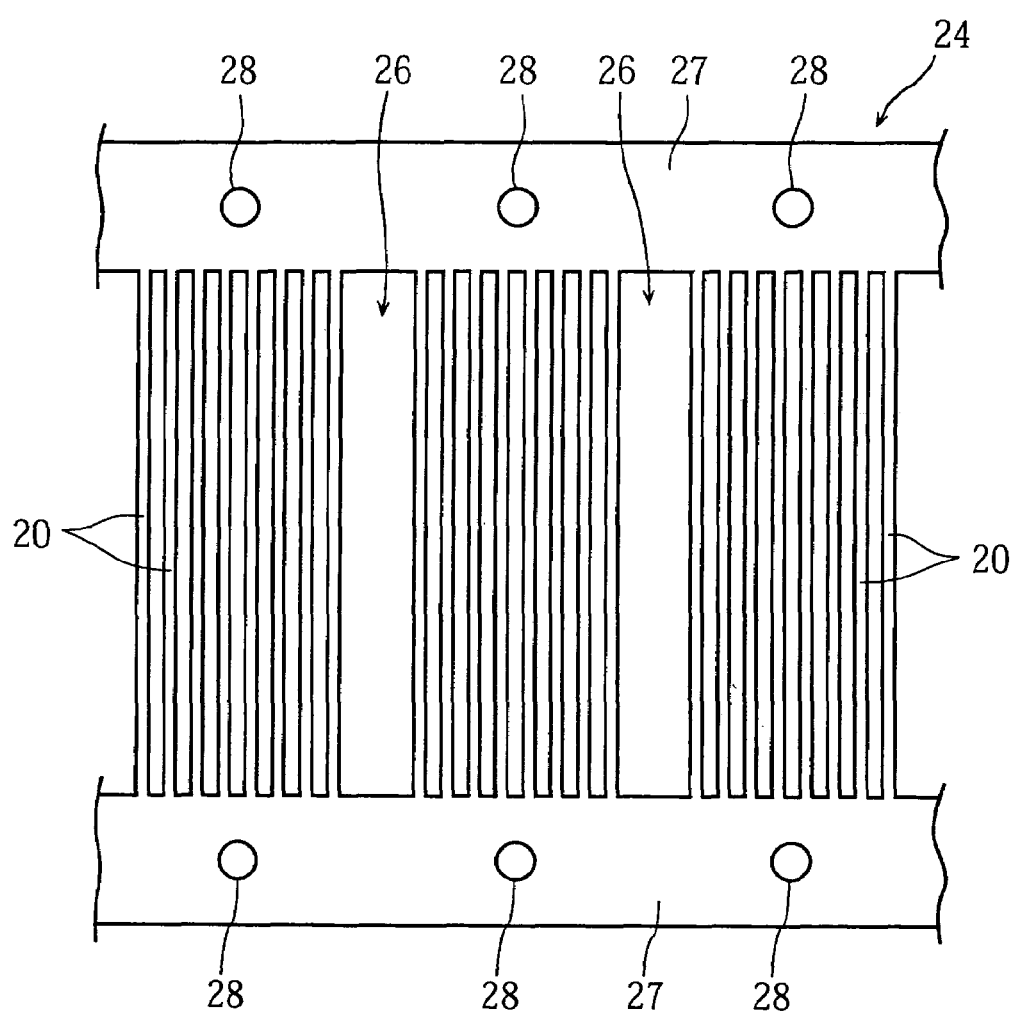
FIGS. 3-6 illustrate a method of manufacturing a joint member of the circuit assembly shown in FIG. 1.

An elongated conductor frame 24 as shown in FIG. 3 is prepared to form the joint member 13. The conductor frame 24 may be made of nickel for example, and its obverse surface may be tin-plated so that a solder material is easily adhered thereto. The conductor frame 24 includes a pair of side bands 27 extending longitudinally of the frame in parallel to each other. Each of the side bands 27 is formed with a plurality of feed perforations 28 for transferring the conductor frame 24. The two side bands 27 are connected to each other via leads 20 arranged in groups. The adjacent groups of leads 20 are separated by division slots 26. Each group of leads 20 will provide the leads of one joint member 10 (FIG. 1).

Figure 4:
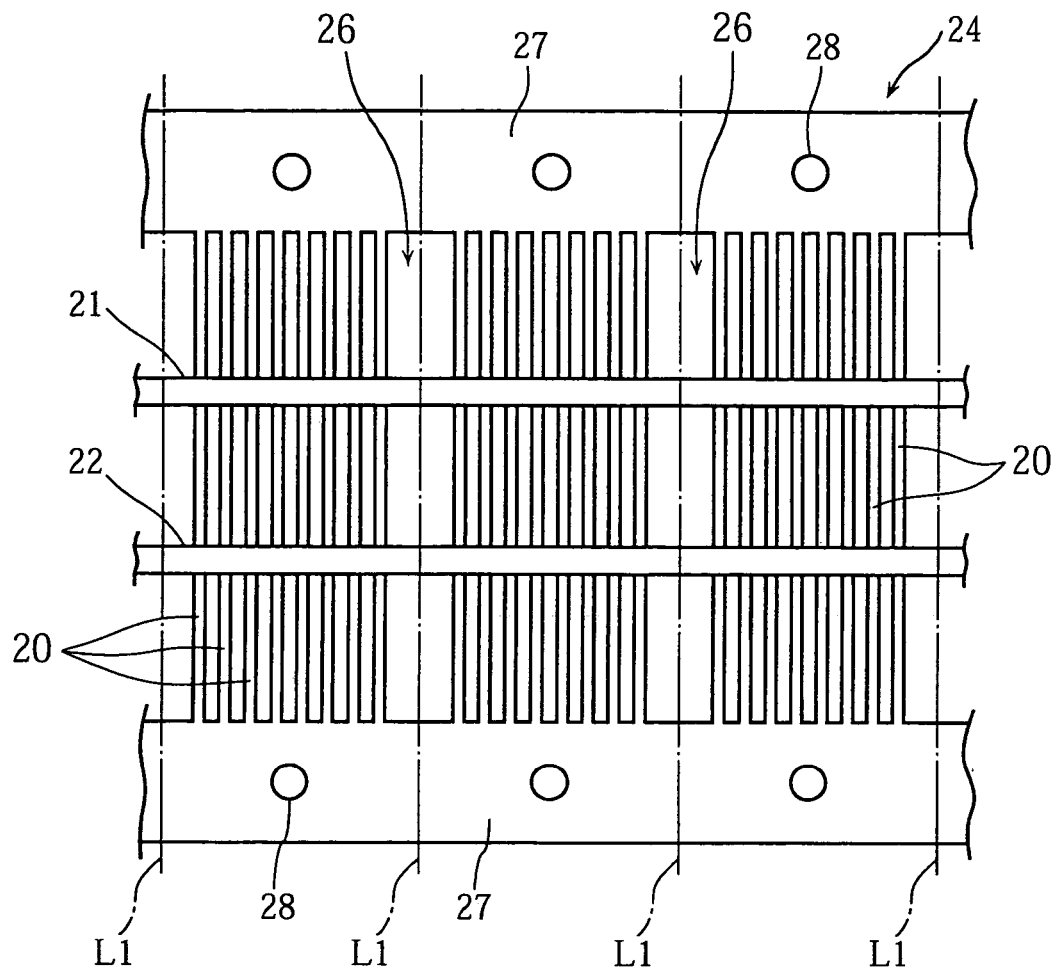
Figure 5:
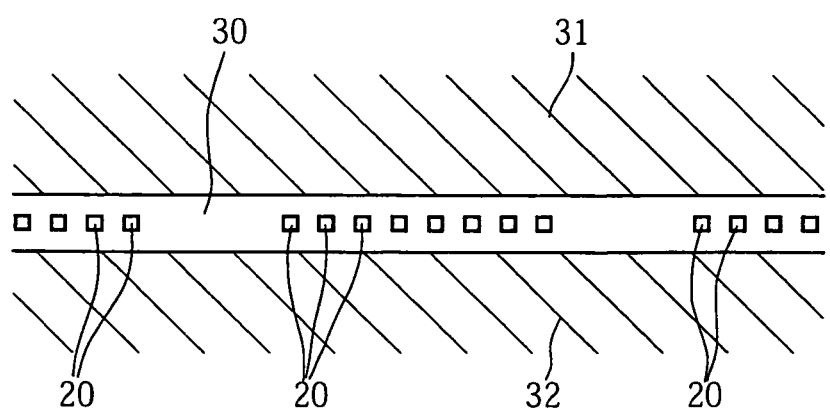

Then, as shown in FIG. 4, a first and a second retainers 21, 22 are formed to extend longitudinally of the conductor frame 24, traversing the respective groups of leads 2. To form the retainers 21, 22, as shown in FIG. 5, the conductor frame 24 is put between a pair of mold members 31, 32 that define cavities 30 corresponding in position to the retainers 21, 22. Then a resin material is injected. After the injected resin is hardened, the mold members 31, 32 are opened. Thus, a conductor frame 24 including leads 20 integrally formed with the first and the second retainers 21, 22 is obtained.

Then, the conductor frame 24 together with the first and the second retainers 21, 22 is cut along the chain lines L1 of FIG. 4 extending through the division slots 26 (i.e. transversely of the conductor frame 24). Thus, as divided pieces of the conductor frame 24, a number of joint members 13, which are still connected to the side bands 27, are obtained, as shown in FIG. 6.

Figure 6:
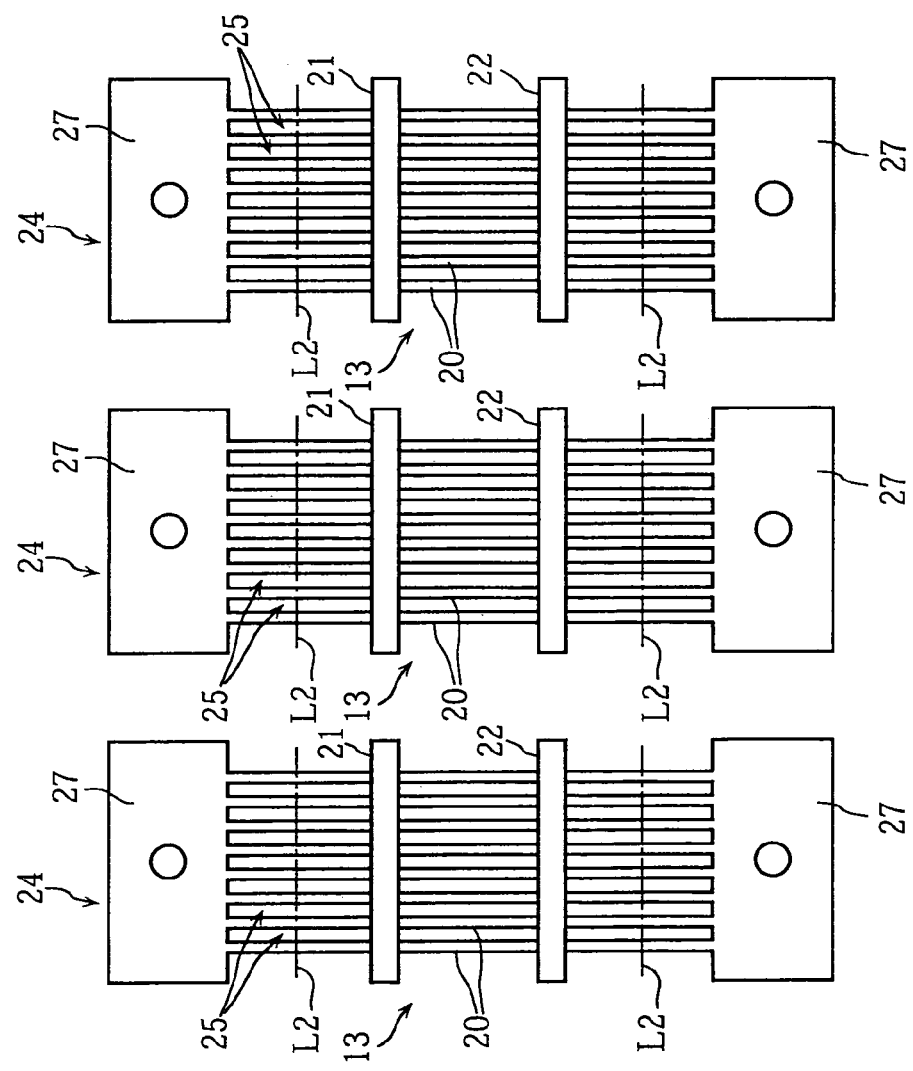

Thereafter, each divided piece of the conductor frame 24 is further cut along the chain lines L2 of FIG. 6 (i.e. perpendicularly to the leads 20). As a result, the unnecessary side bands 27 are removed, to produce a plurality of completed joint members 13.

Figure 7:
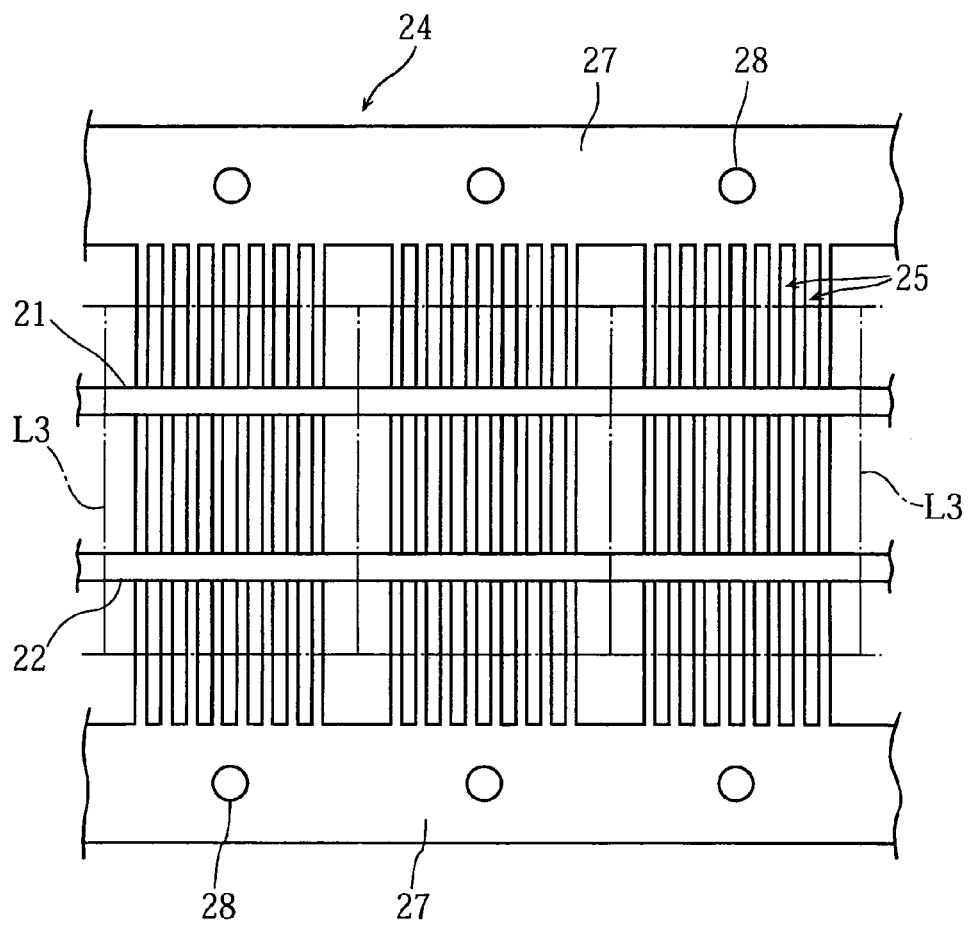
FIG. 7 illustrates another method of manufacturing a joint member.

The use of a conductor frame 24 makes it possible to produce a prescribed number of joint members 13 collectively, which is advantageous to improving the production efficiency. The cutting of the conductor frame 24 may be performed in various ways. For instance, the conductor frame 24 may first be cut longitudinally and then transversely of the frame. Alternatively, as indicated by phantom lines L3 in FIG. 7, the conductor frame 24 may be cut rectangularly.

Each of the joint members 13 manufactured in this way is connected to substrates 11, 12. Specifically, as shown in FIG. 1, the leads 20 of the joint member 13 are soldered to the terminals 17, 18 of the respective substrates 11, 12. Preferably, a solder paste may be applied to the terminals 17, 18 or the ends 20a, 20b of the leads 20 in advance. Then, the solder paste is melted (heated in a reflow oven), with the ends 20a, 20b of each lead 20 positioned precisely onto the relevant terminals 17, 18 of the substrates 11, 12. In this manner, the two substrates 11, 12 are connected to each other by the joint member 13, and a circuit assembly 10 is obtained.

Figure 8:
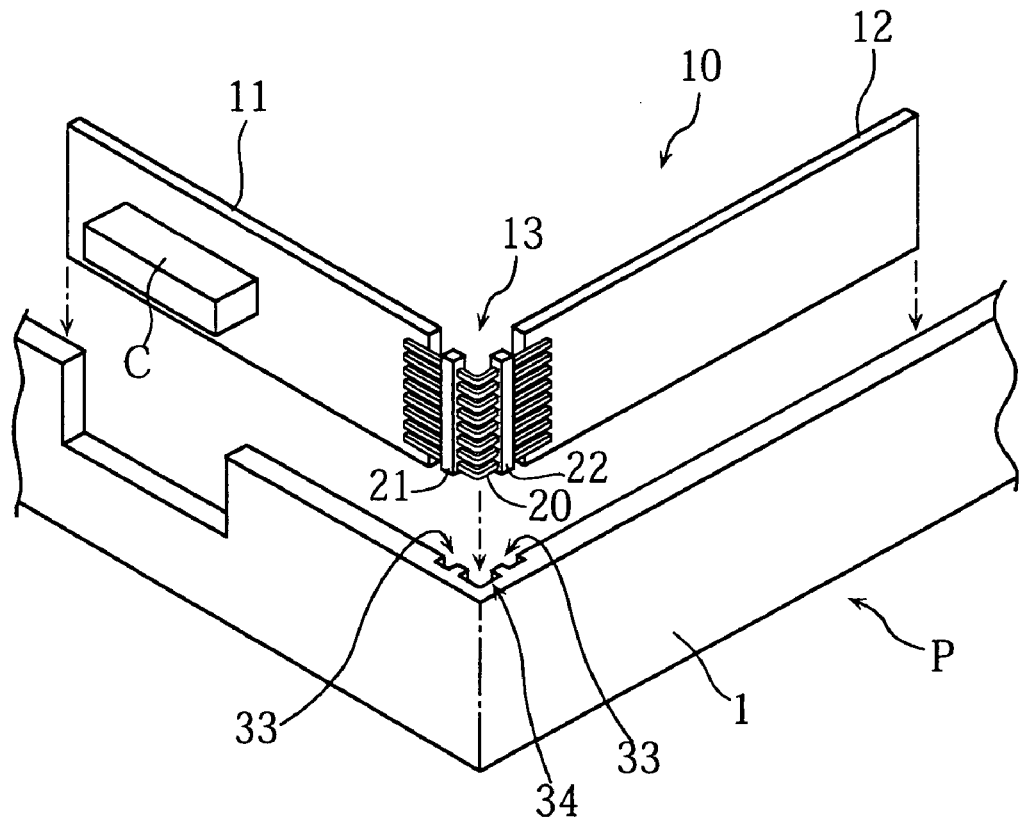
FIG. 8 is a perspective view illustrating a part of the battery pack with the circuit assembly to be fixed.
Figure 9:
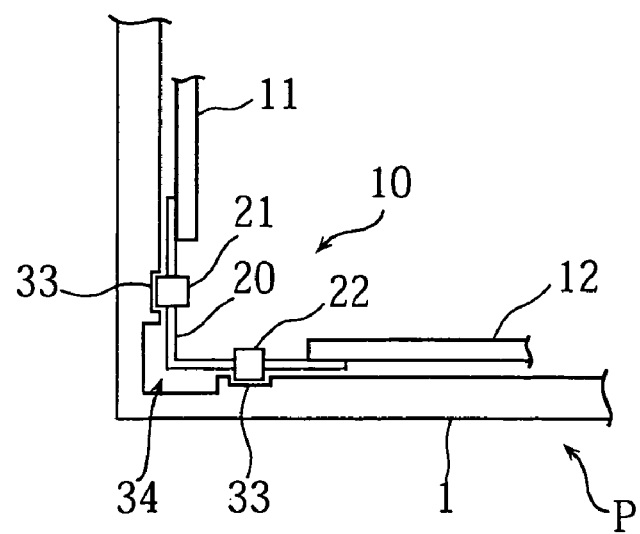
FIG. 9 is a plan view illustrating, a part of the battery pack.

The circuit assembly 10 is accommodated in the housing 1 of a battery pack P in a manner shown in FIGS. 8 and 9 (See also FIG. 15). Specifically, the circuit assembly 10 is positioned at a corner of the battery pack P with the joint member 13 being bent. In its inner surfaces, the housing 1 of the battery pack P is provided with fixing grooves 33 into which the retainers 21, 22 of the joint member 13 are fitted. Also, the corner of the housing 1 is formed with a bend-accommodating portion 34 to provide room for possible protrusion of the leads 20 bent in the middle. With these arrangements, the circuit assembly 10 can be readily attached to the housing 1, and remain to be secured to the housing 1. The inner surfaces of the housing 1 may be provided with an insulating film for preventing the short-circuiting between the leads 20 and the housing 1.

As described above, the joint member 13 is advantageous to ensuring the prevention of the short-circuiting between the leads 20, as well as to allowing the circuit assembly 10 to be accommodated compactly in the battery pack P due to the flexibility of the joint member.

The configuration and size of the joint member 13 may be modified as desired, and may be so adjusted as to correspond to the configuration of the battery pack P. For instance, when the corner of the housing 1 is curved, the joint member 13 may be formed into an arc for enabling proper accommodation in the housing 1.

Figure 10:
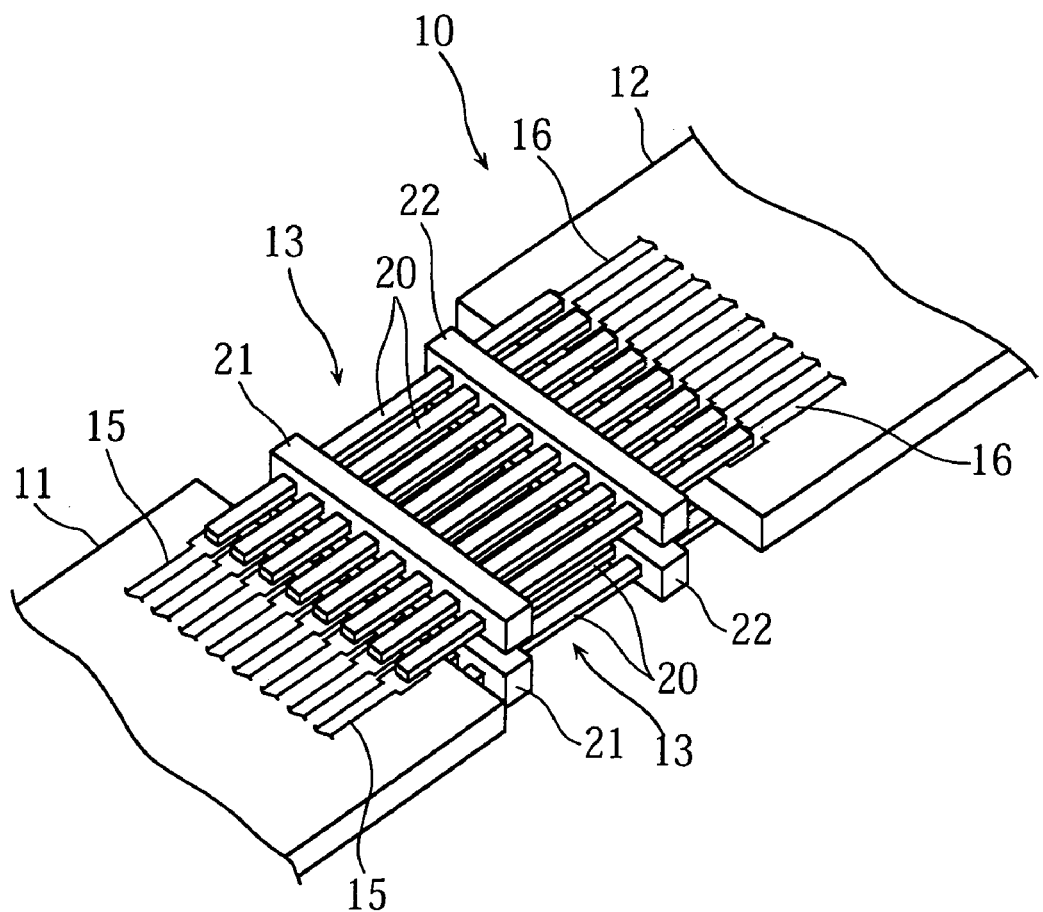
FIG. 10 is a perspective view illustrating a joint member according to another embodiment of the present invention.
Figure 11:
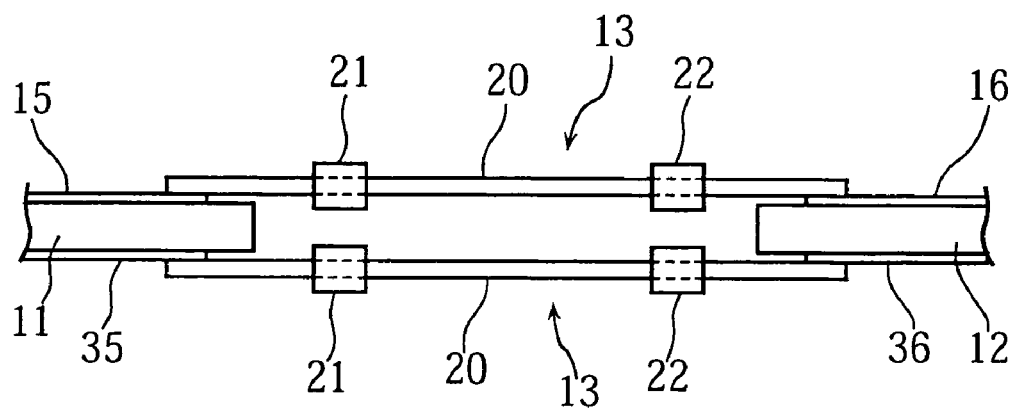
FIG. 11 is a side view of the joint member shown in FIG. 10.

FIGS. 10 and 11 show a second embodiment of the present invention, where two joint members 13 are used for connecting the first and the second substrates 11, 12. Specifically, one of the joint members 13 is connected to wiring patterns 15, 16 formed on the obverse surfaces of the first and the second substrates 11, 12, whereas the other one of the joint members 13 is connected to wiring patterns 35, 36 formed on the reverse surfaces of the first and the second substrates 11, 12. With this structure, a larger amount of signals can be transmitted between the first substrate 11 and the second substrate 12, which increases the density of the circuits in the circuit assembly 10.

Figure 12:
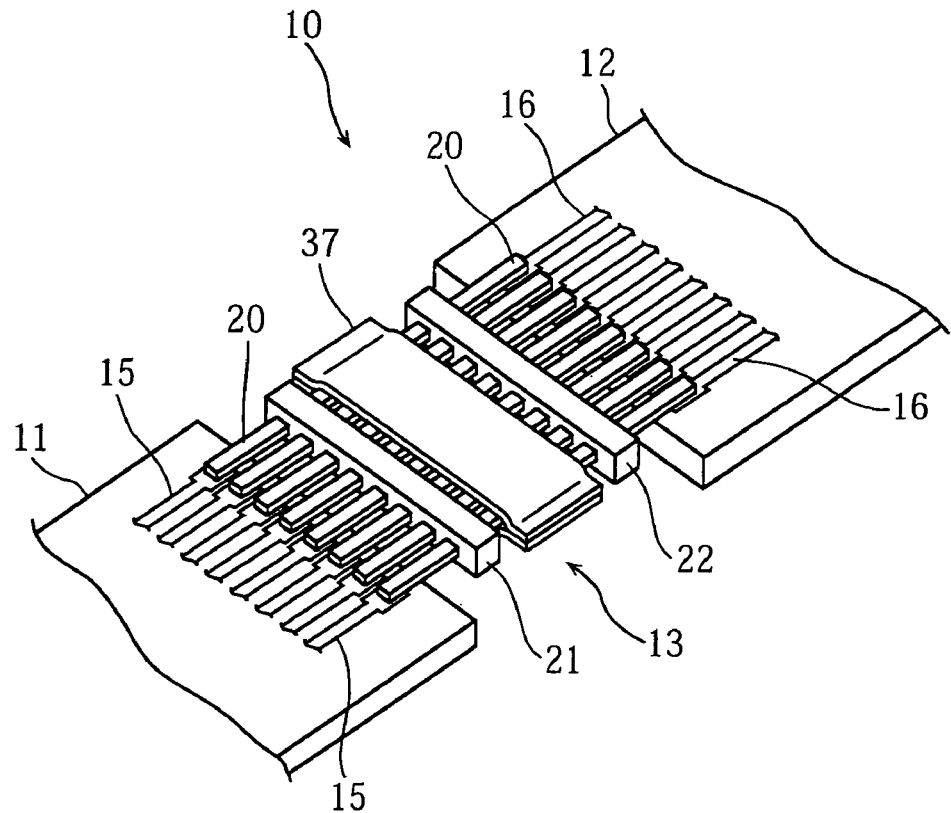
FIG. 12 is a perspective view illustrating a joint member according to another embodiment of the present invention.

FIG. 12 illustrates a third embodiment of the present invention. In this embodiment, the joint member 13 is provided with two insulating tapes 37 sandwiching the leads 20 from above and below between the first and the second retainers 21, 22. The insulating tapes 37 may be formed of polyimide resin for example.

The joint member 13 with the insulating tapes 37 may be formed as follows. In the step shown in FIG. 4, the first and the second retainers 21, 22 are formed. Then, two elongated pieces of insulating tapes 37, extending longitudinally of the conductor frame 24, are attached to the conductor frame 24 between the retainers 21, 22 from the obverse and the reverse sides by thermocompression.

Figure 13:
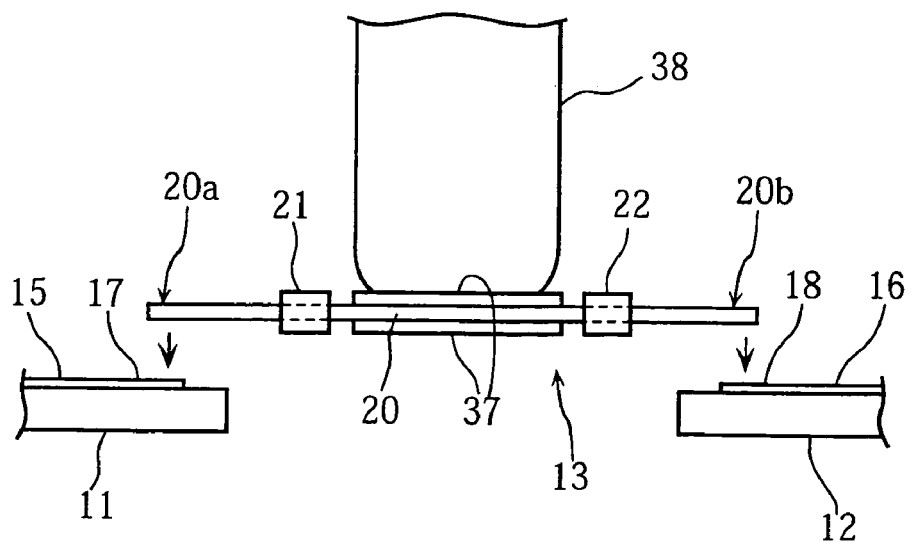
FIG. 13 illustrates a step for making the joint member shown in FIG. 12.

The insulating tapes 37 attached to the leads 20 prevent the leads 20 from coming into direct contact with other parts or the housing 1 of the battery pack P. Further, due to the insulating tapes 37, the joint member 13 roughly resembles a flat package-type semiconductor device. Thus, as shown in FIG. 13, the joint member 13 can reliably be sucked with a suction collet 38 to be transferred. Thus, the ends 20a, 20b of each lead 20 can be readily mounted on the terminals 17, 18 of the substrates 11, 12. The automation using the suction collet 38 shortens the working time and enhances the reliability of the work.

The present invention is not limited to the embodiments described above, and the circuit assembly 10 of the present invention may be utilized for applications other than the battery pack of a mobile electronic device such as a camera or videocassette recorder.

In the above-described embodiments, a two-substrate arrangement is described. However, it is possible to connect three or more substrates by a plurality of joint members. The material, size, configuration, etc. of the retainers, insulating tapes, leads are not limited by the above-described embodiments. The number of leads in a joint member is not limited by the embodiments.

The invention claimed is:

1. A battery pack comprising:
a housing for accommodating a set of batteries; and
a circuit assembly accommodated in the housing at a corner thereof, the circuit assembly including a first substrate formed with a first wiring pattern, a second substrate formed with a second wiring pattern, and a joint member for electrically and/or mechanically connecting the first and the second substrates;
wherein the joint member includes a set of leads physically and electrically separated from each other and extending generally parallel to each other, and a first and a second retainers transversely connecting the leads to each other;
wherein each of the first and the second retainers is formed by molding a resin so as to be integral with the leads, the molding resin filling spaces between the leads, the retainer being spaced away from both the first substrate and the second substrate in a longitudinal direction of the leads;
wherein the joint member further includes insulating tapes sandwiching the set of leads from above and below between the first retainer and the second retainer; and
wherein the first retainer and the second retainer are spaced apart from each other in the longitudinal direction of the leads, and each of the retainers is spaced apart from the insulating tapes in the longitudinal direction of the leads.

2. The battery pack according to claim 1, wherein the set of leads are bent between the first retainer and the second retainer.

3. The battery pack according to claim 1, wherein the first retainer is arranged adjacent to the first substrate, the second retainer being arranged adjacent to the second substrate.

4. A battery pack comprising:
a housing for accommodating a set of batteries; and
a circuit assembly accommodated in the housing at a corner thereof, the circuit assembly including a first substrate formed with a first wiring pattern, a second substrate formed with a second wiring pattern, and a joint member for electrically and/or mechanically connecting the first and the second substrates;
wherein the joint member includes a set of leads physically and electrically separated from each other and extending generally parallel to each other, and a first and a second retainers transversely connecting the leads to each other;
wherein each of the first and the second retainers is formed by molding a resin so as to be integral with the leads, the molding resin filling spaces between the leads, the retainer being spaced away from both the first substrate and the second substrate in a longitudinal direction of the leads; and
wherein said corner of the housing has an inner surface formed with fixing grooves for fixing the first retainer and the second retainer, respectively.

* * * * *